United States Patent
Cai et al.

(10) Patent No.: US 9,978,908 B2
(45) Date of Patent: May 22, 2018

(54) NON-POLAR BLUE LIGHT LED EPITAXIAL WAFER BASED ON LAO SUBSTRATE AND PREPARATION METHOD THEREOF

(71) Applicant: SHANGHAI CHIPTEK SEMICONDUCTOR TECHNOLOGY CO., LTD., Shanghai (CN)

(72) Inventors: Zhuoran Cai, Shanghai (CN); Hai Gao, Shanghai (CN); Zhi Liu, Shanghai (CN); Xianglin Yin, Shanghai (CN); Zhengwei Liu, Shanghai (CN)

(73) Assignee: SHANGHAI CHIPTEK SEMICONDUCTOR TECHNOLOGY CO., LTD., Shanghai (CN)

( * ) Notice: Subject to any disclaimer, the term of this patent is extended or adjusted under 35 U.S.C. 154(b) by 0 days. days.

(21) Appl. No.: 15/128,639

(22) PCT Filed: Mar. 23, 2015

(86) PCT No.: PCT/CN2015/074828
§ 371 (c)(1),
(2) Date: Sep. 23, 2016

(87) PCT Pub. No.: WO2015/144023
PCT Pub. Date: Oct. 1, 2015

(65) Prior Publication Data
US 2017/0110627 A1 Apr. 20, 2017

(30) Foreign Application Priority Data

Mar. 24, 2014 (CN) .......................... 2014 1 0112151

(51) Int. Cl.
*H01L 33/12* (2010.01)
*H01L 33/32* (2010.01)
(Continued)

(52) U.S. Cl.
CPC .............. *H01L 33/12* (2013.01); *C30B 11/14* (2013.01); *C30B 23/025* (2013.01); *C30B 25/18* (2013.01);
(Continued)

(58) Field of Classification Search
CPC ....... H01L 33/12; H01L 33/007; H01L 33/32; H01L 33/04; H01L 33/0062;
(Continued)

(56) References Cited

U.S. PATENT DOCUMENTS 7,285,799 B2 * 10/2007 Kim .................... H01L 33/18
257/101
8,866,127 B2 10/2014 Takahashi et al.
(Continued)

FOREIGN PATENT DOCUMENTS

CN 1761080 A 4/2006
CN 1881625 A 12/2006
(Continued)

OTHER PUBLICATIONS

Canadian Office Action dated Jun. 5, 2017 in corresponding Canadian Patent Application No. 2,942,999.
(Continued)

*Primary Examiner* — Thanhha Pham
(74) *Attorney, Agent, or Firm* — Morgan, Lewis & Bockius LLP

(57) ABSTRACT

A non-polar blue light LED epitaxial wafer based on an LAO substrate comprises the LAO substrate, and a buffer layer, a first non-doped layer, a first doped layer, a quantum well layer, an electron barrier layer and a second doped layer that are sequentially arranged on the LAO substrate. A preparation method of the non-polar blue light LED epitaxial wafer includes: a) adopting the LAO substrate, selecting a crystal orientation, and cleaning a surface of the LAO (Continued)

substrate; b) annealing the LAO substrate, and forming an AlN seed crystal layer on the surface of the LAO substrate; and c) sequentially forming a non-polar m face GaN buffer layer, a non-polar non-doped u-GaN layer, a non-polar n-type doped GaN film, a non-polar InGaN/GaN quantum well, a non-polar m face AlGaN electron barrier layer and a non-polar p-type doped GaN film on the LAO substrate by adopting metal organic chemical vapor deposition.

8 Claims, 3 Drawing Sheets

(51) Int. Cl.
*H01L 33/04* (2010.01)
*H01L 33/00* (2010.01)
*C30B 11/14* (2006.01)
*C30B 23/02* (2006.01)
*C30B 25/18* (2006.01)

(52) U.S. Cl.
CPC .......... *C30B 25/183* (2013.01); *H01L 33/007* (2013.01); *H01L 33/04* (2013.01); *H01L 33/32* (2013.01)

(58) Field of Classification Search
CPC ..... H01L 33/0066; C30B 11/14; C30B 23/02; C30B 23/025; C30B 23/006; C30B 23/063; C30B 23/06; C30B 25/02; C30B 25/10; C30B 25/16; C30B 25/165; C30B 25/18; C30B 25/183; C30B 25/186; C30B 25/205

See application file for complete search history.

(56) References Cited

U.S. PATENT DOCUMENTS

| | | |
|---|---|---|
| 9,099,586 B2 | 8/2015 | Ueda et al. |
| 2009/0008648 A1 | 1/2009 | Biwa et al. |
| 2009/0289270 A1 | 11/2009 | Hanawa et al. |
| 2011/0062437 A1 | 3/2011 | Chang et al. |
| 2012/0171797 A1 | 7/2012 | Kang et al. |
| 2013/0134388 A1 | 5/2013 | Ueda et al. |
| 2013/0240876 A1 | 9/2013 | Chang et al. |
| 2014/0048771 A1 | 2/2014 | Takahashi et al. |

FOREIGN PATENT DOCUMENTS

| | | |
|---|---|---|
| CN | 101901761 A | 12/2010 |
| CN | 103268911 A | 8/2013 |
| CN | 103296159 A | 9/2013 |
| CN | 103311100 A | 9/2013 |
| CN | 203760505 U | 8/2014 |
| CN | 203850326 U | 9/2014 |
| EP | 1 562 237 A2 | 8/2005 |
| JP | 2002-029896 A | 1/2002 |
| JP | 2008-277714 A | 11/2008 |
| JP | 2009-283785 A | 12/2009 |
| JP | 2013-115105 A | 6/2013 |
| TW | 314427 U | 6/2007 |
| WO | 2010-020077 A1 | 2/2010 |
| WO | 2013-132812 A1 | 9/2013 |
| WO | 2015/144023 A1 | 10/2015 |

OTHER PUBLICATIONS

Communication from the EPO dated May 26, 2017 in corresponding EP Application 15 769 396.1.
Japanese Office Action dated Oct. 3, 2017 in corresponding Japanese Application No. 2016-574326.
Korean Office Action dated Sep. 19, 2017 in corresponding Korean Application No. 10-2016-7026454.
Russian Office Action dated Mar. 23, 2015 in corresponding Russian Application No. 2016138668/28(061601) with English translation.
Jeoung Ju Lee et al., "Epitaxial Growth of GaN on LaAlO3(100) Substrate by RF Plasma Assisted Molecular Beam Epitaxy", Appl. Phys. vol. 38, Nov. 11, 1999, two pages.
PCT International Preliminary Report on Patentability and Written Opinion dated Sep. 27, 2016 in counterpart application No. PCT/CN2015/074828, Note: CN1761080 and CN1881625 cited therein are already of record.
Office Action dated Oct. 10, 2015 from The State Intellectual Property Office of the People's Republic of China in counterpart Chinese application No. 201410112151.6.
PCT International Search Report and PCT Written Opinion dated May 28, 2015 (partial translation).

* cited by examiner

NON-POLAR BLUE LIGHT LED EPITAXIAL WAFER BASED ON LAO SUBSTRATE AND PREPARATION METHOD THEREOF

FIELD OF THE INVENTION

The present invention relates to an LED epitaxial wafer and a preparation method thereof, and in particular, to a non-polar blue light LED epitaxial wafer based on an LAO substrate and a preparation method thereof.

BACKGROUND OF THE INVENTION

At present, substrates of LED blue light epitaxial wafers are mainly sapphire. The LED technology based on a sapphire substrate has two serious problems. Firstly, the mismatch rate of the sapphire and a GaN crystal lattice is as high as 17%. Such high lattice mismatch results in a high defect density of the sapphire based LED epitaxial wafer, thereby greatly influencing the luminous efficiency of an LED chip. Secondly, the price of the sapphire substrate is very high, resulting in very high production cost of a nitride LED.

Another major reason for the low luminous efficiency of the LED chip is that the current GaN based LEDs in wide use have polarity. At present, the most ideal material for manufacturing of a high efficient LED device is GaN. The GaN is of a closely packed hexagonal crystal structure, whose crystal faces are divided into a polar face, which is a c face [(0001) face] and non-polar faces, which include an a face [(11-20) face] and an m face [(1-100) face]. Currently, most GaN based LEDs are constructed based on the polar face of the GaN. On the polar face of the GaN, the centroid of the Ga atom cluster does not coincide with the centroid of the N atom cluster, thus forming an electric dipole and generating a spontaneous polarization field and a piezoelectric polarization field, and further, causing a Quantum-confined Stark effect (QCSE). The QCSE causes electrons being separated from holes, and reduces the radiation recombination efficiency of charge carriers, which in turn influences the luminous efficiency of LED, and causes instability of a light emitting wavelength of the LED.

SUMMARY OF THE INVENTION

The technical problem to be solved by the present invention is to provide a non-polar blue light LED epitaxial wafer based on an LAO substrate and a preparation method thereof. The non-polar blue light LED epitaxial wafer has the advantages of low defect density, good crystalline quality and good luminous performance, and having low preparation cost.

The technical solution used for solving the above technical problem of the present invention is to provide a non-polar blue light LED epitaxial wafer based on an LAO substrate, including the substrate. The substrate is the LAO substrate, and a buffer layer, a first non-doped layer, a first doped layer, a quantum well layer, an electron barrier layer and a second doped layer are sequentially arranged on the LAO substrate.

According to the non-polar blue light LED epitaxial wafer based on the LAO substrate, the buffer layer is a non-polar m face GaN buffer layer, the first non-doped layer is a non-polar non-doped u-GaN layer, the first doped layer is a non-polar n-type doped GaN film, the quantum well layer is a non-polar InGaN/GaN quantum well layer, the electron barrier layer is a non-polar m face AlGaN electron barrier layer, and the second doped layer is a non-polar p-type doped GaN film.

To solve the above technical problem, the present invention provides a preparation method of a non-polar blue light LED epitaxial wafer based on an LAO substrate, including the following steps: a) adopting the LAO substrate, selecting the crystal orientation, and cleaning the surface of the LAO substrate; b) annealing the LAO substrate, and forming an AlN seed crystal layer on the surface of the LAO substrate; and c) sequentially forming a non-polar m face GaN buffer layer, a non-polar non-doped u-GaN layer, a non-polar n-type doped GaN film, a non-polar InGaN/GaN quantum well, a non-polar m face AlGaN electron barrier layer and a non-polar p-type doped GaN film on the LAO substrate by adopting metal organic chemical vapor deposition.

According to the above preparation method of the non-polar blue light LED epitaxial wafer based on the LAO substrate, wherein the step b) includes the following processes: baking the LAO substrate at high temperature of 900-1200° C. for 1-4 h followed by cooling to the room temperature in air, then passing N2 plasma to keep the temperature for 30-80 minutes, and forming the AlN seed crystal layer on the surface of the LAO substrate by radio frequency plasma enhanced metal organic chemical vapor deposition, wherein the flow of the N plasma is 40-90 sccm, and the radio frequency power for generating the plasma nitrogen is 200-500 W.

According to the above preparation method of the non-polar blue light LED epitaxial wafer based on the LAO substrate, wherein in the step c), the process of forming the non-polar m face GaN buffer layer is as follows: cooling the LAO substrate to 400-800° C., passing TMGa and the N plasma, and controlling the pressure of a reaction chamber within the range of 400-700 torr, the flow of the N plasma within the range of 40-90 sccm, the radio frequency power of generating the plasma nitrogen within the range of 200-700 W, and the V/III ratio within the range of 800-1200.

According to the above preparation method of the non-polar blue light LED epitaxial wafer based on the LAO substrate, wherein in the step c), the process of forming the non-polar non-doped u-GaN layer is as follows: controlling the temperature of the LAO substrate with the range of 1000-1500° C., passing the TMGa, controlling the pressure of the reaction chamber at 400 torr and the V/III ratio at 180.

According to the above preparation method of the non-polar blue light LED epitaxial wafer based on the LAO substrate, wherein in the step c), the process of forming the non-polar n-type doped GaN film is as follows: controlling the temperature of the LAO substrate within the range of 1000-1300° C., passing the TMGa and SiH4, maintaining the flow of the SiH4 within the range of 60-100 sccm, and controlling the pressure of the reaction chamber at 240 torr, the V/III ratio at 160, and the doped electron concentration within the range of $1.0 \times 10^{17}$ to $5.3 \times 10^{19}$ cm$^{-3}$.

According to the above preparation method of the non-polar blue light LED epitaxial wafer based on the LAO substrate, wherein in the step c), the process of forming the non-polar InGaN/GaN quantum well is as follows:

forming a barrier layer: controlling the temperature of the LAO substrate within the range of 750-950° C., closing H2, passing the TEGa and ammonia gas, and controlling the pressure of the reaction chamber at 200 torr, the V/III ratio at 986, and the thickness within the range of 10-15 nm; and forming a well layer: controlling the temperature of the LAO substrate within the range of 750-950° C., closing H2, passing the TEGa, TMIn and the ammonia gas, and controlling the pressure of the reaction chamber at 200 torr, the V/III ratio at 1439, and the thickness within the range of 2-4 nm.

According to the above preparation method of the non-polar blue light LED epitaxial wafer based on the LAO substrate, wherein in the step c), the process of forming the non-polar m face AlGaN electron barrier layer is as follows: rising the temperature of the LAO substrate to 900-1050° C., passing the TMGa and the ammonia gas, and controlling the pressure of the reaction chamber at 200 torr and the V/III ratio at 986.

According to the above preparation method of the non-polar blue light LED epitaxial wafer based on the LAO substrate, wherein in the step c), the process of forming the non-polar p-type doped GaN film is as follows: controlling the temperature of the LAO substrate within the range of 900-1100° C., passing the TMGa, CP2Mg and the ammonia gas, maintaining the flow of the CP2Mg at 250-450 sccm, and controlling the pressure of the reaction chamber at 200 torr, the V/III ratio within the range of 1000-1250, and the hole doping concentration within the range of $1.0 \times 10^{16}$ to $2.2 \times 10^{18}$ cm$^{-3}$.

Compared with the prior art, the present invention has the following beneficial effects that: according to the non-polar blue light LED epitaxial wafer based on the LAO substrate and the preparation method thereof provided by the present invention, the LAO substrate is adopted, and the buffer layer, the first non-doped layer, the first doped layer, the quantum well layer, the electron barrier layer and the second doped layer are arranged on the LAO substrate in sequence, so that the non-polar blue light LED epitaxial wafer has the advantages of low defect density, good crystalline quality and good luminous performance, and have low preparation cost.

DETAILED DESCRIPTION OF THE EMBODIMENTS

The present invention will be further described below in combination with accompany drawings and embodiments.

Figure 1:
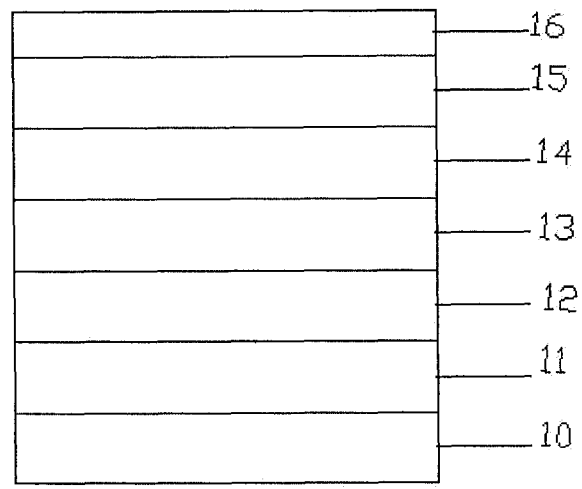
FIG. 1 is a schematic diagram of a structure of a non-polar blue light LED epitaxial wafer based on an LAO substrate of the present invention.

FIG. 1 is a schematic diagram of a structure of a non-polar blue light LED epitaxial wafer based on an LAO substrate of the present invention.

Please refer to FIG. 1. The non-polar blue light LED epitaxial wafer based on the LAO substrate provided by the present invention includes a substrate. The substrate is the LAO substrate, and a buffer layer, a first non-doped layer, a first doped layer, a quantum well layer, an electron barrier layer and a second doped layer are arranged on the LAO substrate in sequence. According to the non-polar blue light LED epitaxial wafer grown on the LAO substrate provided by the present invention, the LAO substrate is also called a lanthanum aluminum oxide substrate which is composed of La, Al and O elements, and the molecular formula is LaAlxOy. As shown in FIG. 1, the non-polar blue light LED epitaxial wafer provided by the present invention includes an LAO substrate 10, a non-polar m face GaN buffer layer 11, a non-polar non-doped u-GaN layer 12, a non-polar n-type doped GaN film 13, a non-polar InGaN/GaN quantum well layer 14, a non-polar m face AlGaN electron barrier layer 15 and a non-polar p-type doped GaN film 16, which are arranged from bottom to top in sequence.

Figure 2:
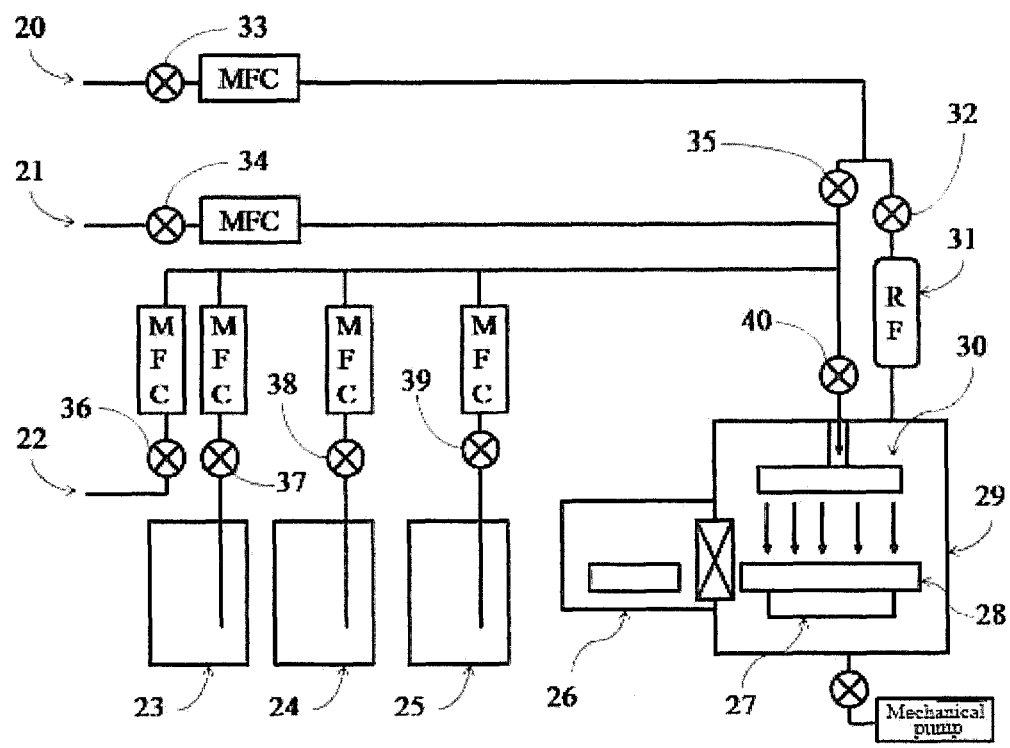
FIG. 2 is a schematic diagram of a structure of a preparation device for a non-polar blue light LED epitaxial wafer based on an LAO substrate of the present invention.

FIG. 2 is a schematic diagram of a structure of a preparation device for a non-polar blue light LED epitaxial wafer based on an LAO substrate of the present invention. Please refer to FIG. 2. 20 and 21 respectively represent NH3 and SiH4, which are used for providing N and Si; 22 represents H2, which is used as a carrier gas and for conveying Cp2Mg, TMGa and TMIn; 23, 24 and 25 respectively represent the Cp2Mg, the TMGa and the TMIn, which are used for providing Mg, Ga and In necessary for the growth of LED; 26 represents is a mechanical arm, which is used for conveying the substrate and a sample; 27 represents a radio frequency induction heater, which is used for heating and controlling the temperature of the substrate; 28 represents a graphite plate, which is used for bearing the LAO substrate; 29 represents a reaction chamber, which is used for generating chemical reactions on various reactant gases to generate the LED; 30 represents a spray head, which is a device used for uniformly jetting the fully mixed reactant gases onto the surface of the substrate; 31 represents a radio frequency plasma source device, which is used for providing active N; and 32-40 represent valves, which are used for controlling the gas conveyance states of various pipelines. MFC represents a flow controller, which is used for controlling the gas flow to meet the growth demands.

Figure 3:
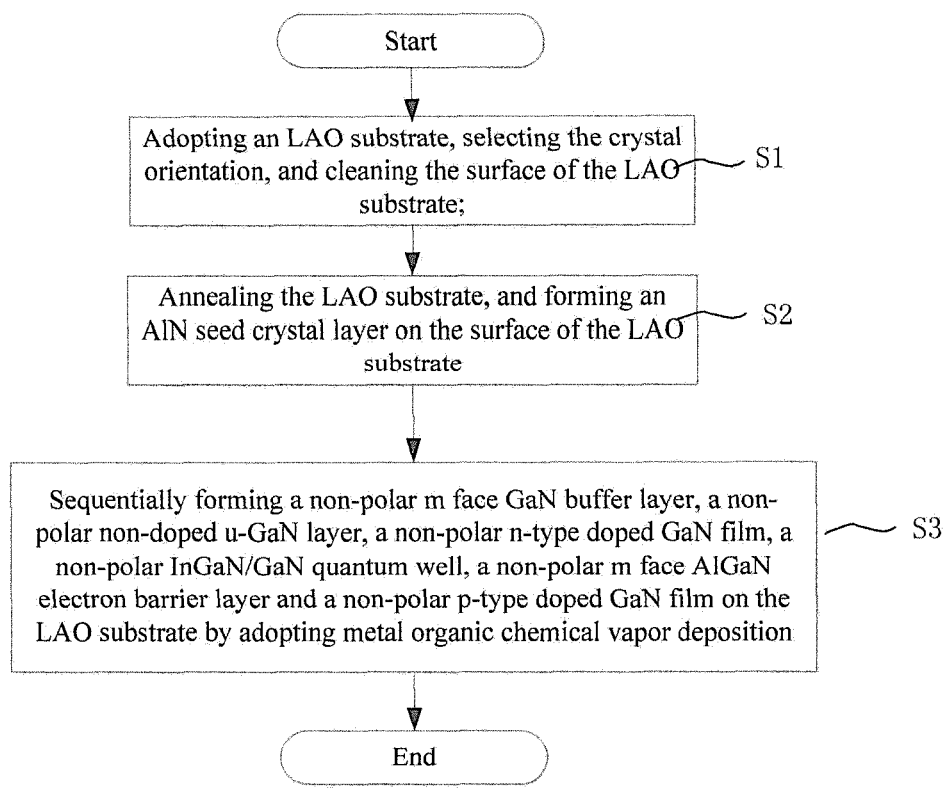
FIG. 3 is a schematic flow chart of a preparation of a non-polar blue light LED epitaxial wafer based an LAO substrate of the present invention.

FIG. 3 is a schematic flow chart of a preparation of a non-polar blue light LED epitaxial wafer based an LAO substrate of the present invention.

Please refer to FIG. 3. the preparation method of the non-polar blue light LED epitaxial wafer grown on the LAO substrate of the present invention specifically includes the following steps:

step S1: adopting the LAO substrate, selecting the crystal orientation, and cleaning the surface of the LAO substrate;

step S2: annealing the LAO substrate, and forming an AlN seed crystal layer on the surface of the LAO substrate; and step S3 sequentially forming a non-polar m face GaN buffer layer, a non-polar non-doped u-GaN layer, a non-polar n-type doped GaN film, a non-polar InGaN/GaN quantum well, a non-polar m face AlGaN electron barrier layer and a non-polar p-type doped GaN film on the LAO substrate by metal organic chemical vapor deposition. A specific embodiment is provided below with the preparation steps and process conditions as follows:

(1) adopting an LAO substrate, and selecting the crystal orientation;

(2) cleaning the surface of the substrate;

(3) annealing the substrate: baking the substrate at high temperature of 900-1200° C. for 1-4 h followed by cooling the substrate to the room temperature in air, then passing N2 plasma to keep the temperature for 30-80 minutes, and forming an AlN seed crystal layer on the surface of the substrate to provide a template for the growth of a GaN film, wherein the flow of the N plasma is 40-90 sccm, and the radio frequency power for generating the plasma nitrogen is 200-500 W;

(4) growing a non-polar m face GaN buffer layer by radio frequency (RF) plasma enhanced metal organic chemical vapor deposition (MOCVD), wherein the process conditions are as follows: the substrate is cooled to 400-800° C., the TMGa and the N plasma are passed, the pressure of a reaction chamber is 400-700 torr, the flow of the N plasma is 40-90 sccm, the radio frequency power of generating the plasma nitrogen is 200-700 W, and the V/III ratio is 800-1200;

(5) growing a non-polar non-doped u-GaN layer by the MOCVD process, wherein the process conditions are as follows: the temperature of the substrate is 1000-1500° C., the TMGa is passed, the pressure of the reaction chamber is 400 torr, and the V/III ratio is 180;

(6) growing a non-polar n-type doped GaN film by the MOCVD process, wherein the process conditions are as follows: the temperature of the substrate is 1000-1300° C., the TMGa and SiH4 are passed, the flow of the SiH4 is maintained at 60-100 sccm, the pressure of the reaction chamber is 200 torr, the V/III ratio is 160, and the doped electron concentration is $1.0 \times 10^{17}$ to $5.3 \times 10^{19}$ cm$^{-3}$;

(7) growing a non-polar InGaN/GaN quantum well by the MOCVD process, wherein the process conditions for forming a barrier layer are as follows: the temperature of the LAO substrate is 750-950° C., H2 is closed, the TEGa and ammonia gas are passed, the pressure of the reaction chamber is 200 torr, the V/III ratio is 986, and the thickness is 10-15 nm; and wherein the process conditions for forming a well layer are as follows: the temperature of the LAO substrate is 750-950° C., H2 is closed, the TEGa, TMIn and the ammonia gas are passed, the pressure of the reaction chamber is 200 torr, the V/III ratio is 1439, and the thickness is 2-4 nm;

(8) growing a non-polar m face AlGaN electron barrier layer by the MOCVD process, wherein the process conditions are as follows: the temperature of the LAO substrate is raised to 900-1050° C., the TMGa and the ammonia gas are passed, the pressure of the reaction chamber is 200 torr, and the V/III ratio is 986; and (9) growing a non-polar p-type doped GaN film by the MOCVD process, wherein the process conditions are as follows: the temperature of the LAO substrate is 900-1100° C., the TMGa, CP2Mg and the ammonia gas are passed, the flow of the CP2Mg is maintained at 250-450 sccm, the pressure of the reaction chamber is 200 torr, the V/III ratio is 1000-1250, and the doped hole concentration is $1.0 \times 10^{16}$ to $2.2 \times 10^{18}$ cm$^{-3}$.

Figure 4:
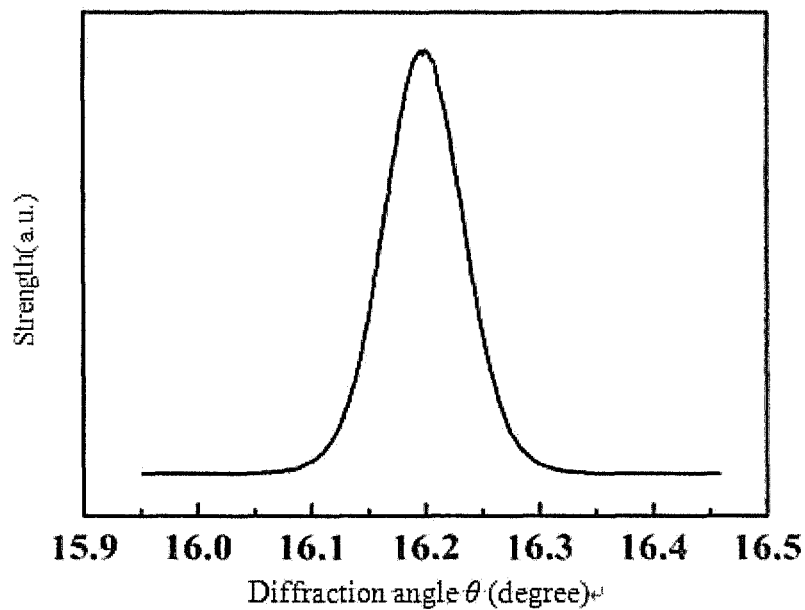
FIG. 4 is an XRD test diagram of a non-polar blue light LED epitaxial wafer grown on a (001) face of an LAO substrate of the present invention.

FIG. 4 is an XRD test diagram of a non-polar blue light LED epitaxial wafer grown on a (001) face of an LAO substrate of the present invention.

FIG. 4 shows a full width at half maximum (FWHM) value of a X ray rocking curve of the LED epitaxial wafer as tested in the present invention. The full width at half maximum (FWHM) value is less than 0.1 degree, which indicates that the non-polar blue light LED epitaxial wafer prepared in the present invention has very good performance no matter on defect density or on crystalline quality.

Figure 5:
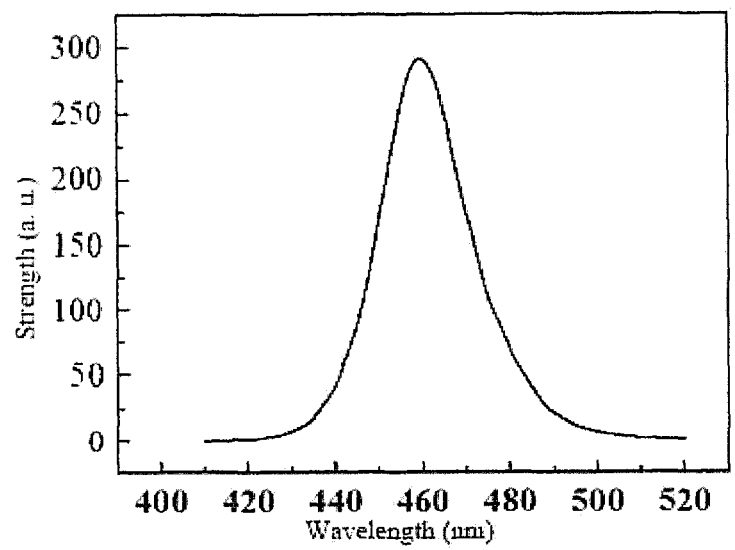
FIG. 5 is a PL spectrum test diagram of a non-polar m face blue light LED epitaxial wafer grown on an LAO substrate of the present invention at the room temperature.

FIG. 5 is a PL spectrum test diagram of a non-polar m face blue light LED epitaxial wafer grown on an LAO substrate of the present invention at the room temperature.

FIG. 5 shows a emission peak having a wavelength of 460 nm, and the full width at half maximum of 23 nm, as tested by a PL spectrum at a temperature of 293K in the present invention. This indicates that the non-polar GaN film prepared in the present invention has very good performance on optical properties.

Figure 6:
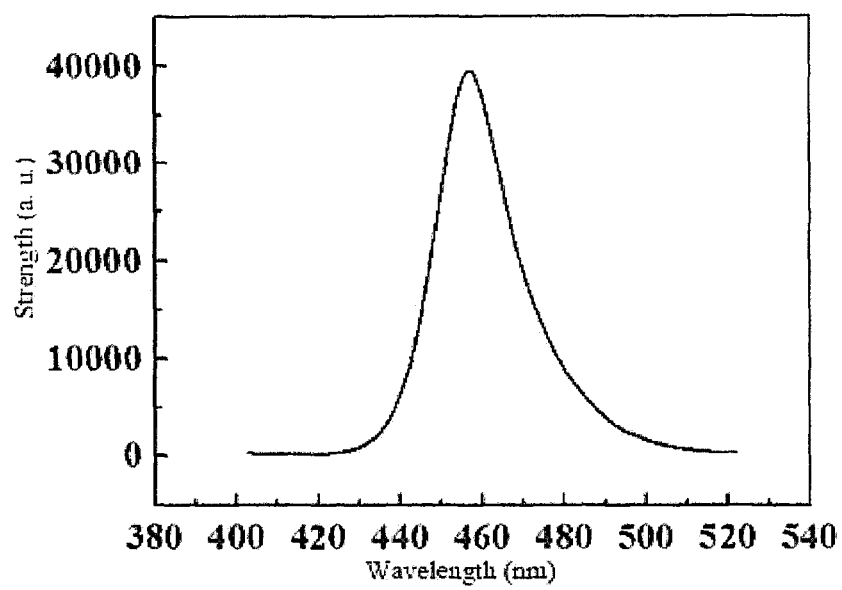
FIG. 6 is an EL spectrum test diagram of a non-polar m face blue light LED epitaxial wafer grown on an LAO substrate of the present invention at the room temperature.

FIG. 6 is an EL spectrum test diagram of a non-polar m face blue light LED epitaxial wafer grown on an LAO substrate of the present invention at the room temperature.

FIG. 6 shows a emission peak having a wavelength of 461 nm, the full width at half maximum of 22 nm and the output power of 7.8 mw@20 mA, as tested by an EL spectrum at the temperature of 293K in the present invention. This indicates that the non-polar GaN film prepared in the present invention has very good performance on electrical properties.

In summary, the present invention provides a non-polar blue light LED epitaxial wafer based on the LAO substrate and the preparation method thereof. The LAO substrate is adopted, and the non-polar m face GaN buffer layer, the non-polar non-doped u-GaN layer, the non-polar n-type, doped GaN film, the non-polar InGaN/GaN quantum well, the non-polar m face AlGaN electron barrier layer and the non-polar p-type doped GaN film are arranged on the LAO substrate in sequence. Compared with the prior art, the present invention has the advantages of simple growth process and low preparation cost, and the non-polar blue light LED epitaxial wafer prepared has the advantages of low defect density, good crystalline quality and good electrical and optical performances.

Although the present invention has been disclosed above by the preferred embodiments, the present invention is not limited hereto, any skilled in the art can made some modifications and perfections without departing from the spirit or scope of the present invention which are covered and by the appended claims.

The invention claimed is:

1. A preparation method of a non-polar blue light LED epitaxial wafer based on a LAO, lanthanum aluminum oxide, substrate, the non-polar blue light LED epitaxial wafer comprising a buffer layer, a first non-doped layer, a first doped layer, a quantum well layer, an electron barrier layer and a second doped layer, sequentially arranged on the LAO substrate, wherein the buffer layer is a non-polar m face GaN buffer layer, the first non-doped layer is a non-polar non-doped u-GaN layer, the first doped layer is a non-polar n-type doped GaN film, the quantum well layer is a non-polar InGaN/GaN quantum well layer, the electron barrier layer is a non-polar m face AlGaN electron barrier layer, and the second doped layer is a non-polar p-type doped GaN film, the preparation method comprising the following steps:

a) adopting the LAO substrate, selecting the crystal orientation, and cleaning the surface of the LAO substrate;

b) annealing the LAO substrate, and forming an AlN seed crystal layer on the surface of the LAO substrate; and c) sequentially forming the non-polar m face GaN buffer layer, the non-polar non-doped u-GaN layer, the non-polar n-type doped GaN film, the non-polar InGaN/GaN quantum well, the non-polar m face AlGaN electron barrier layer and the non-polar p-type doped GaN film on the LAO substrate by adopting metal organic chemical vapor deposition.

2. The preparation method of the non-polar blue light LED epitaxial wafer based on the LAO substrate according to claim 1, wherein said step b) comprises the following process:

baking the LAO substrate at high temperature of 900-1200° C. for 1-4 h followed by cooling to the room temperature in air, then passing N2 plasma to keep the temperature for 30-80 minutes, and forming the AlN seed crystal layer on the surface of the LAO substrate by radio frequency plasma enhanced metal organic chemical vapor deposition, the flow of the N plasma is 40-90 sccm, and the radio frequency power for generating the plasma nitrogen is 200-500 W.

3. The preparation method of the non-polar blue light LED epitaxial wafer based on the LAO substrate according to claim 1, wherein in said step c), the process of forming the non-polar m face GaN buffer layer is as follows: cooling the LAO substrate to 400-800° C., passing TMGa and the N plasma, and controlling the pressure of a reaction chamber within the range of 400-700 torr, the flow of the N plasma within the range of 40-90 sccm, the radio frequency power of generating the plasma nitrogen within the range of 200-700 W, and the V/III ratio within the range of 800-1200.

4. The preparation method of the non-polar blue light LED epitaxial wafer based on the LAO substrate according to claim 1, wherein in said step c), the process of forming the non-polar non-doped u-GaN layer is as follows: controlling the temperature of the LAO substrate with the range of 1000-1500° C., passing the TMGa, controlling the pressure of the reaction chamber at 400 torr and the V/III ratio at 180.

5. The preparation method of the non-polar blue light LED epitaxial wafer based on the LAO substrate according to claim 1, wherein in said step c), the process of forming the non-polar n-type doped GaN film is as follows: controlling the temperature of the LAO substrate within the range of 1000-1300° C., passing the TMGa and SiH4, maintaining the flow of the SiH4 within the range of 60-100 sccm and controlling the pressure of the reaction chamber at 240 torr, the V/III ratio at 160, and the doped electron concentration within the range of $1.0 \times 10^{17}$ to $5.3 \times 10^{19}$ cm$^{-3}$.

6. The preparation method of the non-polar blue light LED epitaxial wafer based on the LAO substrate according to claim 1, wherein in said step c), the process of forming the non-polar InGaN/GaN quantum well includes:
    forming a barrier layer: controlling the temperature of the LAO substrate within the range of 750-950° C., closing H2, passing the TEGa and ammonia gas, and controlling the pressure of the reaction chamber at 200 torr, the V/III ratio at 986, and the thickness within the range of 10-15 nm; and
    forming a well layer: controlling the temperature of the LAO substrate within the range of 750-950° C., closing H2, passing the TEGa, TMIn and the ammonia gas, and controlling the pressure of the reaction chamber at 200 torr, the V/III ratio at 1439, and the thickness within the range of 2-4 nm.

7. The preparation method of the non-polar blue light LED epitaxial wafer based on the LAO substrate according to claim 1, wherein in said step c), the process of forming the non-polar m face AlGaN electron barrier layer is as follows: rising the temperature of the LAO substrate to 900-1050° C., passing the TMGa and the ammonia gas, and controlling the pressure of the reaction chamber at 200 torr and the V/III ratio at 986.

8. The preparation method of the non-polar blue light LED epitaxial wafer based on the LAO substrate according to claim 1, wherein in said step c), the process of forming the non-polar p-type doped GaN film is as follows: controlling the temperature of the LAO substrate within the range of 900-1100° C., passing the TMGa, CP2Mg and the ammonia gas, maintaining the flow of the CP2Mg at 250-450 sccm, and controlling the pressure of the reaction chamber at 200 torr, the V/III ratio within the range of 1000-1250, and the hole doping concentration within the range of $1.0 \times 10^{16}$ to $2.2 \times 10^{18}$ cm$^{-3}$.

* * * * *